United States Patent [19]

Go et al.

[11] Patent Number: 4,614,880
[45] Date of Patent: Sep. 30, 1986

[54] POWER SUPPLY CIRCUITRY FOR A MICROCOMPUTER SYSTEM

[75] Inventors: Yasunao Go; Yoshiharu Ueki; Minoru Motohashi; Kozo Nozawa; Sadami Hattori, all of Kawagoe, Japan

[73] Assignee: Pioneer Electronic Corporation, Tokyo, Japan

[21] Appl. No.: 548,243

[22] Filed: Nov. 3, 1983

[30] Foreign Application Priority Data

Nov. 5, 1982 [JP] Japan .................. 57-167470[U]

[51] Int. Cl.[4] .................. H03K 3/013; G06F 11/00
[52] U.S. Cl. .................. 307/200 A; 307/296 R; 364/707
[58] Field of Search .................. 307/200 A, 296 R; 364/707

[56] References Cited

U.S. PATENT DOCUMENTS 4,234,920 11/1980 Van Ness et al. .................. 307/200 A
4,433,390 2/1984 Carp et al. .................. 307/200 A
4,518,865 5/1985 Iwasaki .................. 307/200 A Primary Examiner—John S. Heyman
Attorney, Agent, or Firm—Fleit, Jacobson, Cohn & Price

[57] ABSTRACT

A power supply circuitry for a microcomputer system made up of a control unit including a microprocessor and a peripheral circuit, is provided with a delay switch circuit (55) for controlling the operation of the second regulator means (41) which provides a power current to the peripheral circuit of the microcomputer system. The delay switch circuit is responsive to a reset signal produced by a reset signal generating means connected to a first regulator means (34) for the control unit, and generates a signal for activating the second regulator means shortly after the extinction of the reset signal so that the operation of the peripheral circuit is prevented during a period of a reset operation of the microprocessor.

6 Claims, 6 Drawing Figures

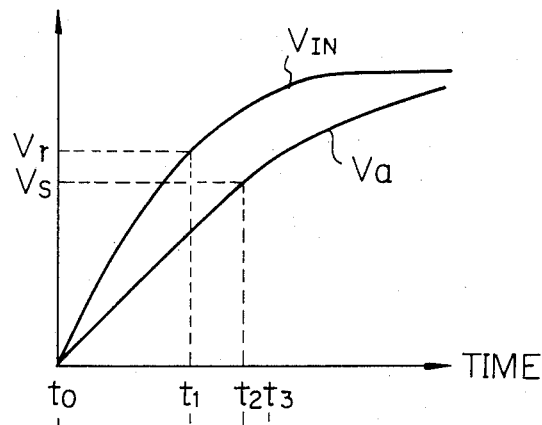
Fig. 3A
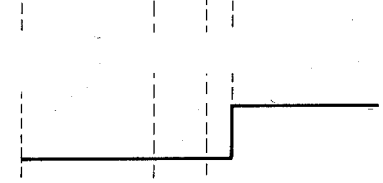
Fig. 3B
Fig. 3C
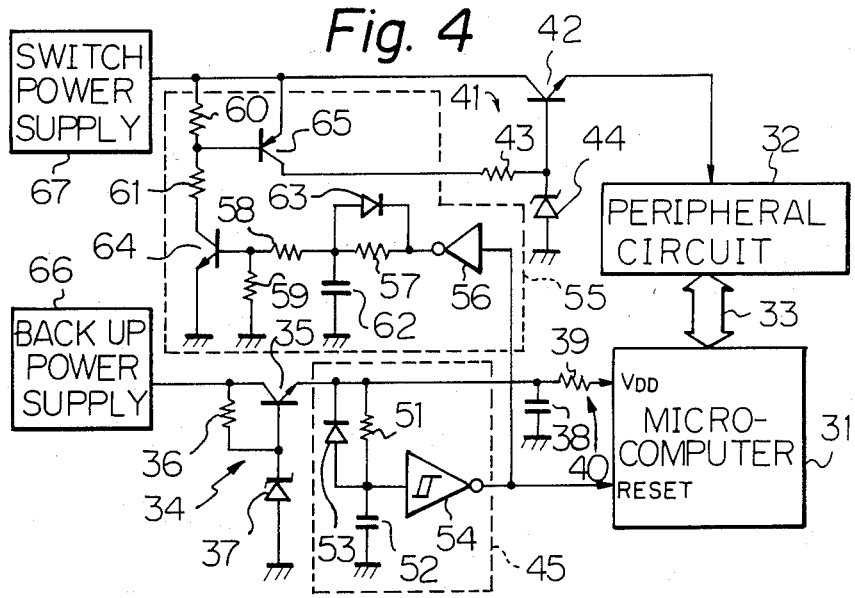
Fig. 4

POWER SUPPLY CIRCUITRY FOR A MICROCOMPUTER SYSTEM

BACKGROUND OF THE INVENTION

1. Field of the Invention

The present invention relates to a power supply circuitry for a microcomputer system.

2. Description of Background Information

In a microcomputer system including a microprocessor unit, memories, and a peripheral circuit such as a control circuit of input/output devices, it is general to apply a reset signal to the microprocessor unit shortly after the starting of the power supply. If, however, the peripheral circuit is activated during the reset operation of the microprocesor, it is very likely that the malfunction of the input/output devices will occur in accordance with erroneous command signals from the microprocessor unit.

Since the prior art power supply circuitries for the microcomputer system were generally constructed to supply the power currents of the microprocessor unit and the peripheral circuit at the same time, it was difficult to prevent the mulfunction of the microcomputer system at the starting period of the power supply. Therefore, it has been required to develop a power supply circuitry for a microcomputer system which can eliminate the above mentioned malfunciton of the microcomputer system.

SUMMARY OF THE INVENTION

An object of the present invention is therefore to alleviate the drawback of the prior art power supply circuitries and to provide a power supply circuitry for a microcomputer system in which the power supply of the peripheral circuit is delayed until the reset operation of the microprocessor unit is completed.

According to the present invention, a power supply circuitry for a control unit including at least a microprocessor and for a peripheral circuit connected to the control unit, comprises a first power supply means for supplying a power current to the control unit in accordance with a command of the power supply, a reset signal generating means for generating a reset signal from a point of time not later than a time at which the control unit enters into an operational state, for a time period longer than a predetermined length, and a second power supply means for supplying a power current to the peripheral circuit after the extinction of the reset signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following description taken in conjunction with the accompanying drawings which are given by way of illustration only, and thus are not limitative of the present invention, and wherein:

FIGS. 3A to 3C are waveform diagrams respectively showing waveforms of signals at several points of the circuitry shown in FIG. 2; and FIG. 4 is a circuit diagram showing another embodiment of the power supply circuitry according to the present invention.

DETAILED DESCRIPTION OF THE PREFERRED EMBODIMENTS

Figure 1:
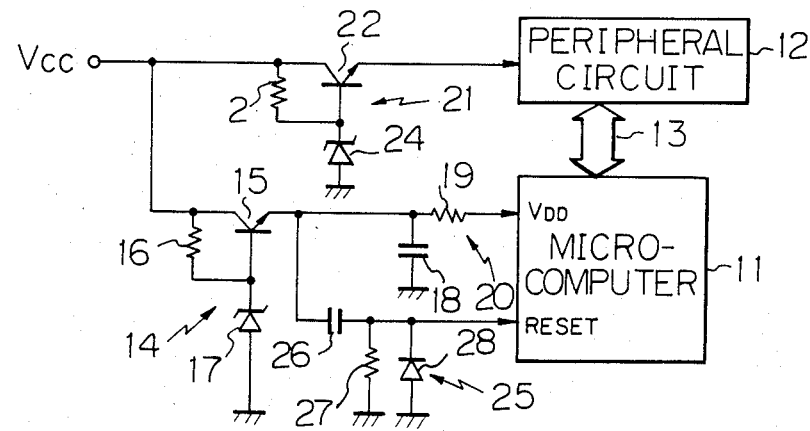
FIG. 1 is a circuit diagram exemplary showing a prior art power supply circuitry for a microcomputer system.

Before entering into the explanation of the preferred embodiments, reference is first made to FIG. 1 in which an example of the conventional power supply circuitry for a microcomputer system is illustrated.

As shown, the microcomputer generally denoted by 11 is a so-called one chip microcomputer which includes such elements as a microprocessor, a clock generation circuit, a RAM (Random Access Memory), and a ROM (Read Only Memory). At an in/out port of the microcomputer 11, there is connected a peripheral circuit 12 via a bus 13. The peripheral circuit 12 may be a controller of an input-output device. At a power voltage input terminal $V_{DD}$ of the microcomputer 11, there is applied a power current Vcc from a voltage regulator circuit 14. The voltage regulator circuit 14 is a series connected type made up of a transistor 15, a resistor 16, and a Zener diode 17. Between the input terminal $V_{DD}$ and the voltage regulator circuit 14, there is disposed a smoothing circuit 20 made up of a capacitor 18 and a resistor 19. On the other hand, the peripheral circuit 12 is also supplied with the power voltage Vcc through a voltage regulator circuit 21 which, like the voltage regulator circuit 14, is made up of a transistor 22, resistor 23, and a Zener diode 24. Further, an output terminal of the voltage regulator circuit 14, i.e., the emitter of the transistor 15, is connected to the reset terminal of the microcomputer 11 via a reset circuit 25. The reset circuit 25 consists of a differentiating circuit 25 made up of a capacitor 26 and a resistor 27, and a clamp diode 18, and produces a reset signal of a positive pulse for a predetermined time period when an input signal is applied thereto.

In the above explained power supply circuitry of the conventional technique, the microcomputer 11 and the peripheral circuit 12 are supplied with the regulated voltage respectively through the voltage regulator circuit 14 and the voltage regulator circuit 21 when the power voltage Vcc is supplied, and at the same time the microcomputer 11 starts its reset operation upon receiving the reset signal from the reset circuit 25.

However, in this power current supply circuitry, as mentioned before, the peripheral circuit 12 enters into the operating state during a reset period in which the reset signal is supplied to the microcomputer 11. Therefore, there is a problem that a malfunction of the elements such as the input-output device can occur due to the operation of the peripheral circuit 12, depending on the state of the in/out port of the microcomputer 11.

Figure 2:
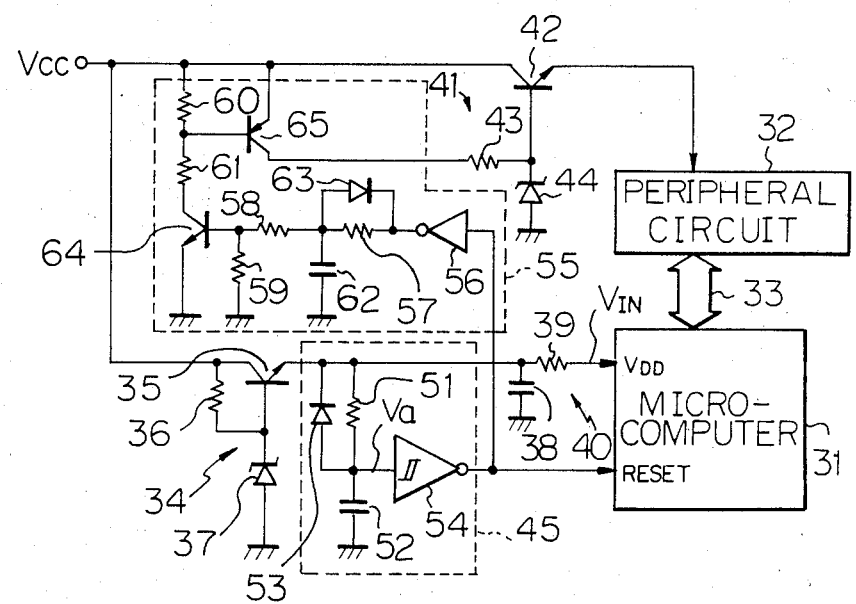
FIG. 2 is a circuit diagram showing the power supply circuitry according to the present invention.

An embodiment of the power current supply system according to the present invention will be explained with reference to FIG. 2 hereinafter.

As shown, the microcomputer generally denoted by 31 is a so-called one chip microcomputer which includes such elements as a microprocessor, a clock generation circuit, a RAM (Random Access Memory), and a ROM (Read Only Memory). At an in/out port of the microcomputer 31, there is connected a peripheral circuit 32 via a bus 33. The peripheral circuit 32 may be a controller of an input-output device. At a power voltage input terminal $V_{DD}$ of the microcomputer 31, there is applied a power current Vcc from a voltage regulator circuit 34. The voltage regulator circuit 34 is a series connected type made up of a transistor 35, a resistor 36, and a Zener diode 37.

Between the input terminal $V_{DD}$ and the voltage regulator circuit 34, there is disposed a smoothing circuit 40 made up of a capacitor 38 and a resistor 39. Further, an output terminal of the voltage regulator circuit 34, i.e., the emitter of the transistor 35, is connected to the reset terminal of the microcomputer 31 via a reset circuit 45. The reset circuit 45 consists of an integrating circuit made up of a register 51, a capacitor 52 and a diode 53, and a Schmitt circuit 54. With this circuit construction, the output voltage of the voltage regulator 34 is integrated and then applied to the Schmitt circuit 54. An output terminal of the Schmitt circuit 54 is connected to the reset terminal of the microcomputer 31 as an output signal of the reset circuit 45. On the other hand, the peripheral circuit 32 is also supplied with the power voltage Vcc through a voltage regulator circuit 41 which, like the voltage regulator circuit 34, is made up of a transistor 42, resistor 43, and a Zener diode 44. Further, at the output terminal of the Schmitt circuit, there is connected a delay switch circuit 55 for controlling the operation of the voltage regulator circuit 41. The delay switch circuit 55 consists of an inverter 56, resistors 57 to 61, a capacitor 62, a diode 63, transistors 64 and 65. An output terminal of the inverter 56 which receives an output signal of the Schmitt circuit, is connected to an integrated circuit made up of the resistor 57, capacitor 62, and the diode 63. An output terminal of the integrated circuit is then connected to the base of the NPN transistor 64 via a voltage divider circuit made up of the resistors 58 and 59. At the collector of the transistor 64, there is supplied the power voltage Vcc via series resistors 60 and 61, and the emitter of the transistor 54 is grounded. The junction between the resistors 60 and 61 is connected to the base of the PNP transistor 65 whose emitter is connected to the power voltage Vcc. The collector of the transistor 65 is connected to the base of the transistor 42 and a base current of the transistor 42 is supplied when the transistor 65 turns on.

The operation of the power supply circuitry according to the present invention will be explained with reference to the waveform diagrams of FIGS. 3A to 3C.

Firstly, when a power voltage Vcc is applied at a time $t_0$, a voltage level $V_{IN}$ of the power current from the smoothing circuit 19 at the power input terminal $V_{DD}$ of the microcomputer 11 increases in a manner as shown in FIG. 3A during a transitional period. On the other hand, an integration output signal Va of the reset circuit 45 exhibits a rise up curve slower than the rise up speed of the voltage level $V_{IN}$ due to a time constant determined by the resistor 51 and the capacitor 52. Since the Schmitt circuit 54 produces a high level output signal when an input signal, i.e., the signal Va is lower than an inversion level Vs, it transmits the high level reset signal to the reset input terminal of the microcomputer at the same time as the initiation of the power supply as shown in FIG. 3B. In addition, since the level of the output signal of the inverter 56 becomes low when the level of output signal of the Schmitt circuit 54 is high, the transistor 64 turns off. Consequently, the transistors 65 and 42 are turned off and the peripheral circuit 32 is not supplied with the power current.

Nextly, at a time $t_1$, the voltage $V_{IN}$ at the power supply input terminal $V_{DD}$ of the microcomputer 31 reaches a voltage Vr of starting the operation and the microcomputer 31 enters into its operation. At the same time as the starting of the operation, the microcomputer 31 initiate a reset operation in accordance with the reset signal from the reset circuit 45. During this period after the starting of the power supply, the level Va of the integration signal gradually increases and it exceeds the inversion level Vs at a time $t_2$, as the result, the ouput signal of the Schmitt circuit 54 turns low to stop the generation of the reset signal. Accordingly, the reset operation of the microcomputer 31 ceases and the level of the output signal of the inverter 56 becomes high. Since this high level signal is integrated in accordance with the time constant determined by the resistor 57 and the capacitor 62 and applied to the base of the transistor 64, the transistor 64 turns on at a time $t_3$ which is predetermined period after the time $t_2$. Since the transistor 65 turns on by the activation of the transistor 64, the transistor 42 is applied with the base current and the voltage regulator 41 starts its operation, the output signal of the voltage regulator 41 rises up at the timing shown in FIG. 3C, and is applied to the peripheral circuit 32. Further, it is to be noted that the duration of the reset time from the time $t_1$ to $t_2$ is sufficient for the initiation of the microcomputer 31.

FIG. 4 shows the second embodiment of the power supply device according to the present invention in which, the microcomputer 31 and the peripheral circuit 32 are respectively applied with the power currents from different two sources of power current 66 and 67, instead of using a single source as the case of the previous embodiment. Further, in this embodiment, the power source 66 for the microcomputer 31 is of a type capable of a back-up operation, and a switch power supply is selected for the power source 67 for the peripheral circuit 32. With this provision, it becomes possible to prevent the malfunction of the input/output device during reset period, by arranging the system to supply the power current of the peripheral circuit 32 only when the power current from the back-up power supply 66 is supplied to the microcomputer 31.

It will be appreciated from the foregoing that the power supply circuitry according to the present invention is characterized in that the peripheral circuit is supplied with the power current after the completion of the reset operation of the control unit including a microprocessor, i.e., after the extinction of the reset signal. Therefore, the operation of the peripheral circuit is prevented during the reset period and the malfunction of the input/output device is prevented even if the state of the input/output port of the microprocessor is not completely initialized during the reset period. Moreover, since the power supply of the pheripheral circuit is delayed until the voltage of the power current supplied to the control unit becomes stable, the control unit is sufficiently protected from beeing applied, at input-/output port, with an electric current having a voltage higher than the predetermined level during a period of the start of power supply.

It should be understood that the foregoing description is for illustrative purpose only, and is not intended to limit the scope of the invention. Rather, there are numerous equivalents to the preferred embodiments, and such are intended to be covered by the appended claims.

While particular embodiments of the present invention have been shown and described, it will be obvious to those skilled in the art that changes and modifications may be made without departing from this invention in its broader aspects, and therefore, the aim in the appended claims is to cover all such changes and modifications as fall within the true spirit and scope of this invention.

What is claimed is:

1. A power supply circuitry for a control unit including at least a microprocessor and for a peripheral circuit connected to the control unit, comprising:
   first power supply means for supplying a power current to said control unit in accordance with a command of the power supply;
   reset signal generating means connected to said first power supply means, for generating a reset signal from a point of time not later than a time at which said control unit enters into an operational state, for a time period longer than a predetermined length; and
   second power supply means connected to said reset signal generating means, for supplying a power current to said peripheral circuit in response to said reset signal, said second power supply means including delay means for delaying a transmission of an extinction of said reset signal so that said power current is supplied to said peripheral circuit a predetermined time period after the extinction of said reset signal.

2. A power supply circuitry for a microcomputer system having a control unit including a microprocessor and for a peripheral circuit connected to the control unit, comprising:
   a first regulator means for receiving a current from a source of power current and producing a first power current having a predetermined voltage level, to be supplied to said control unit;
   a reset signal generating means connected to said first regulator means for generating a reset signal to be applied to a reset input terminal of said control unit for a predetermined time after the starting of the power supply to the control unit;
   a second regulator means for producing a second power current having a predetermined voltage level, to be supplied to said peripheral circuit; and
   a control means responsive to said reset signal for supplying said second power current after an extinction of said reset signal, said control means including a delay means for delaying a transmission of an extinction of said reset signal for a predetermined time period, so that the supply of said second power current is initiated the predetermined time period after the extinction of said reset signal.

3. A circuitry as set forth in claim 2, wherein said second regulator means receives the current from said source of power current.

4. A circuitry as set forth in claim 2, wherein said first regulator means receives a current from a second source of power current.

5. A power supply circuitry as set forth in claim 3, wherein said reset signal generating means comprises an integration circuit connected to an output terminal of the first regulator means and a Schmitt circuit connected to said integration circuit to produce a high level reset signal when a voltage level of an input signal from said integration circuit is lower than a predetermined reference level.

6. A power supply circuitry for a microcomputer system having a control unit including a microprocessor and for a peripheral circuit connected to the control unit, comprising:
   a first regulator means for receiving a current from a source of power current and producing a first power current having a predetermined voltage level, to be supplied to said control unit;
   a reset signal generating means connected to said first regulator means for generating a reset signal to be applied to a reset input terminal of said control unit for a predetermined time after the starting of the power supply to the control unit;
   a second regulator means for receiving a current from said source of power current and for producing a second power current having a predetermined voltage level, to be supplied to said peripheral circuit; and
   a control means responsive to said reset signal for controlling the supply of said second power current in a manner that the supply of said second power current is initiated after extinction of said reset signal, wherein said reset signal generating means comprises an integration circuit connected to an output terminal of the first regulator means and a Schmitt circuit connected to said integration circuit to produce a high level reset signal when a voltage level of an input signal from said integration circuit is lower than a predetermined reference level, and wherein said control means takes the form of a delay switch circuit comprising an inverter circuit connected to said Schmitt circuit, a second integration circuit connected to said inverter circuit, and switching transistors responsive to an output signal of said second integration circuit for producing a control signal of said second regulator means, whereby activating said second regulator means when a voltage level of an output signal of said second integration circuit reaches a predetermined level.

* * * * *